(12) United States Patent
Yabuuchi

(10) Patent No.: US 11,374,504 B2
(45) Date of Patent: Jun. 28, 2022

(54) ELECTRIC POWER CONVERTER

(71) Applicant: Mitsubishi Electric Corporation, Tokyo (JP)

(72) Inventor: Naoya Yabuuchi, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 17/051,250

(22) PCT Filed: Oct. 24, 2018

(86) PCT No.: PCT/JP2018/039501
§ 371 (c)(1),
(2) Date: Oct. 28, 2020

(87) PCT Pub. No.: WO2019/244368
PCT Pub. Date: Dec. 26, 2019

(65) Prior Publication Data
US 2021/0367533 A1 Nov. 25, 2021

(30) Foreign Application Priority Data
Jun. 20, 2018 (JP) ............................ JP2018-116879

(51) Int. Cl.
*H02M 1/44* (2007.01)
*H02M 7/5387* (2007.01)
*H02M 7/00* (2006.01)
*H03H 7/01* (2006.01)

(52) U.S. Cl.
CPC ........... *H02M 7/5387* (2013.01); *H02M 1/44* (2013.01); *H02M 7/003* (2013.01); *H03H 7/0115* (2013.01)

(58) Field of Classification Search
CPC ...... H02M 1/44; H02M 7/003; H02M 7/5387; H02M 1/42; H02M 7/44; H03H 7/0115
See application file for complete search history.

(56) References Cited

U.S. PATENT DOCUMENTS

| | | | |
|---|---|---|---|
| 9,538,634 B2 | 1/2017 | Yamaguchi | |
| 2010/0060328 A1* | 3/2010 | Ingman | H01L 23/345 |
| | | | 327/113 |
| 2014/0376293 A1 | 12/2014 | West | |

(Continued)

FOREIGN PATENT DOCUMENTS

| | | |
|---|---|---|
| CN | 203851107 U | 9/2014 |
| CN | 206211835 U | 5/2017 |

(Continued)

OTHER PUBLICATIONS

International Search Report of PCT/JP2018/039501 dated Jan. 8, 2019 [PCT/ISA/210].

(Continued)

*Primary Examiner* — Gary L Laxton
(74) *Attorney, Agent, or Firm* — Sughrue Mion, PLLC; Richard C. Turner

(57) ABSTRACT

An electric power converter is configured to perform conversion of power supplied from a power source. The electric power converter includes: a plurality of first capacitors connected in series between two lines to be used for supply of the power; and at least one second capacitor connected between a ground and a connection point between two first capacitors among the plurality of first capacitors.

12 Claims, 11 Drawing Sheets

(56) References Cited

U.S. PATENT DOCUMENTS

| | | |
|---|---|---|
| 2015/0070102 A1 | 3/2015 | Dai et al. |
| 2018/0278141 A1* | 9/2018 | Hasegawa ............. H02M 5/458 |
| 2019/0207534 A1* | 7/2019 | Mueller ............ H02M 7/53871 |

FOREIGN PATENT DOCUMENTS

| | | |
|---|---|---|
| EP | 0 980 003 A1 | 2/2000 |
| EP | 2 421 131 A2 | 2/2012 |
| JP | 5-161268 A | 6/1993 |
| JP | 2006-136058 A | 5/2006 |
| JP | 2008-312403 A | 12/2008 |
| JP | 2010-288381 A | 12/2010 |
| JP | 2014-039162 A | 2/2014 |
| JP | 2014-216997 A | 11/2014 |
| JP | 6195691 B1 | 9/2017 |
| WO | 2006/018007 A1 | 2/2006 |

OTHER PUBLICATIONS

Written Opinion of PCT/JP2018/039501 dated Jan. 8, 2019 [PCT/ISA/237].
Japanese Office Action of JP2018-116879 dated Dec. 25, 2018.
Extended European Search Report dated Jul. 2, 2021 from the European Patent Office in EP Application No. 18923027.9.
Communication dated Sep. 29, 2021 by the European Patent Office in application No. 18 923 027.9.

\* cited by examiner

ELECTRIC POWER CONVERTER

CROSS REFERENCE TO RELATED APPLICATIONS

This application is a National Stage of International Application No. PCT/JP2018/039501 filed on Oct. 24, 2018, claiming priority based on Japanese Patent Application No. 2018-116879 filed on Jun. 20, 2018, the disclosure of which is incorporated herein in its entirety by reference.

TECHNICAL FIELD

The present invention relates to an electric power converter configured to perform conversion of power supplied from a power source.

BACKGROUND ART

An electric power converter is a device configured to convert power supplied from a power source to change various electrical quantities, specifically, a voltage, a current, a frequency, a phase, the number of phases, and the like. Various types of electric and electronic equipment can be utilized through use of this electric power converter.

There is known one type of electric power converter, which is configured to perform power conversion through use of switching elements. In recent years, the electric power converter of this type has been developed to have a higher frequency. The reason therefor is because a higher frequency provides advantages such as a higher efficiency, downsizing, and reduction in weight. However, as the frequency becomes higher, there arises a need to deal with generation of a noise in a high frequency range. Further, in order to conform to Guojia Biaozhun (GB)/T 184488.1, which is established as a recommended standard of the national standards of People's Republic of China, or other laws and regulations, it is required to ensure insulation resistance between a high voltage line and the ground.

In the electric power converter, in general, measures are taken against a normal mode noise by arranging a capacitor between in general, measures are taken against a common mode noise by arranging a capacitor between a line and the ground. In the following description, a "capacitor between lines" is referred to as "X capacitor", and a "capacitor between a line and the ground" is referred to as "Y capacitor". However, each of the X capacitor and the Y capacitor has a parasitic inductance caused by electrode structure or the like.

In the electric power converter having a higher frequency, this parasitic inductance cannot be ignored. Therefore, in the electric power converter having a higher frequency, the parasitic inductance of the X capacitor causes reduction in bypass performance of the normal mode noise. Further, in the electric power converter having a higher frequency, the parasitic inductance of the Y capacitor causes reduction in bypass performance of the common mode noise.

For such reasons, hitherto, an attempt has been made to reduce parasitic inductance components. As an electric power converter configured to reduce the parasitic inductance components, there has been known an electric power converter in which Y capacitors, which are arranged so that common mode noises flow therethrough in opposite directions, are connected between two signal lines and the ground (see, for example, Patent Literature 1). As described above, the two Y capacitors are magnetically coupled to each other so that a mutual inductance takes a negative value, and thus the inductance component of each Y capacitor is reduced. Therefore, the common mode noise is more efficiently removed.

CITATION LIST

Patent Literature

[PTL 1] JP 6075834 B2

SUMMARY OF INVENTION

Technical Problem

As for the Y capacitor through which the common mode noise flows, as described above, insulation resistance is required to be ensured between the line and the ground. A capacitor tends to be larger in size as a rated voltage becomes larger. Adopting a capacitor having a larger size is not desired in terms of downsizing the electric power converter. In view of the above, when the insulation resistance between the signal line and the ground is to be ensured, it is also important to consider the point of view of downsizing the electric power converter.

The present invention has been made to solve the above-mentioned problems, and has an object to provide an electric power converter that can be further downsized while insulation resistance between a line and the ground is ensured.

Solution to Problem

An electric power converter according to the present invention is assumed to perform conversion of power supplied from a power source, the electric power converter including: a plurality of first capacitors connected in series between two lines to be used for supply of the power; and at least one second capacitor connected between a ground and a connection point between two first capacitors among the plurality of first capacitors.

Advantageous Effects of Invention

According to the present invention, it is possible to further downsize the electric power converter while insulation resistance between the line and the ground is ensured.

DESCRIPTION OF EMBODIMENTS

With reference to the drawings, an electric power converter according to each embodiment of the present invention is described below.

First Embodiment

Figure 1:
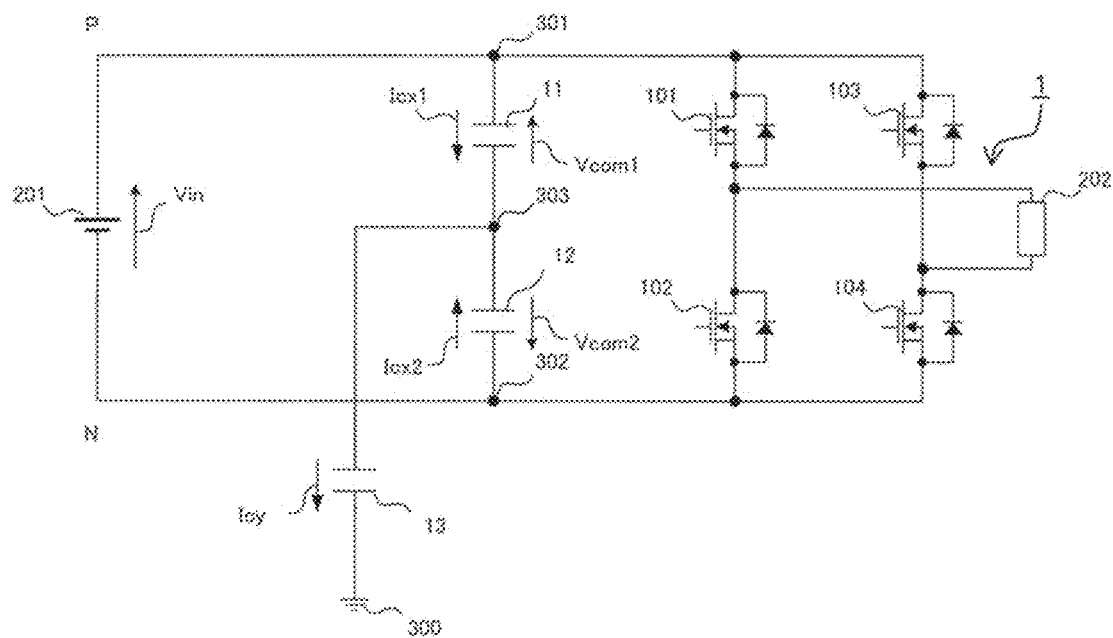
FIG. 1 is a diagram for illustrating an example of a circuit configuration of an electric power converter according to a first embodiment of the present invention.

FIG. 1 is a diagram for illustrating an example of a circuit configuration of an electric power converter according to a first embodiment of the present invention.

As illustrated in FIG. 1, an electric power converter 1 is an inverter device configured to perform ON/OFF control of four switching elements 101 to 104 to convert power supplied from a power source 201. The power source 201 is configured to generate a DC voltage Vin.

In the first embodiment, metal-oxide-semiconductor field effect transistors (MOSFETs) are adopted as the switching elements 101 to 104, but adoptable switching elements are not limited to MOSFETs. Insulated gate bipolar transistors (IGBTs) or other semiconductor elements can be widely adopted as the switching elements. The type of the electric power converter 1 is also not limited to an inverter device.

A positive side, that is, a P side of the power source 201 is connected to each of a drain of the switching element 101 and a drain of the switching element 103, and a negative side, that is, an N side of the power source 201 is connected to each of a source of the switching element 102 and a source of the switching element 104. A source of the switching element 101 is connected to a drain of the switching element 102, and a source of the switching element 103 is connected to a drain of the switching element 104. In this manner, between terminals of the power source 201, the switching elements 101 and 102 connected in series to each other and the switching elements 103 and 104 connected in series to each other are connected in parallel to each other. A load 202, that is, electronic or electric equipment to which the electric power converter 1 supplies power is connected to each of the source of the switching element 101 and the source of the switching element 103.

Each of the switching elements 101 to 104 is controlled to be turned on or off by a control unit (not shown). Therefore, for example, each of gates of the switching elements 101 to 104 is directly connected to the control unit.

Figure 3:
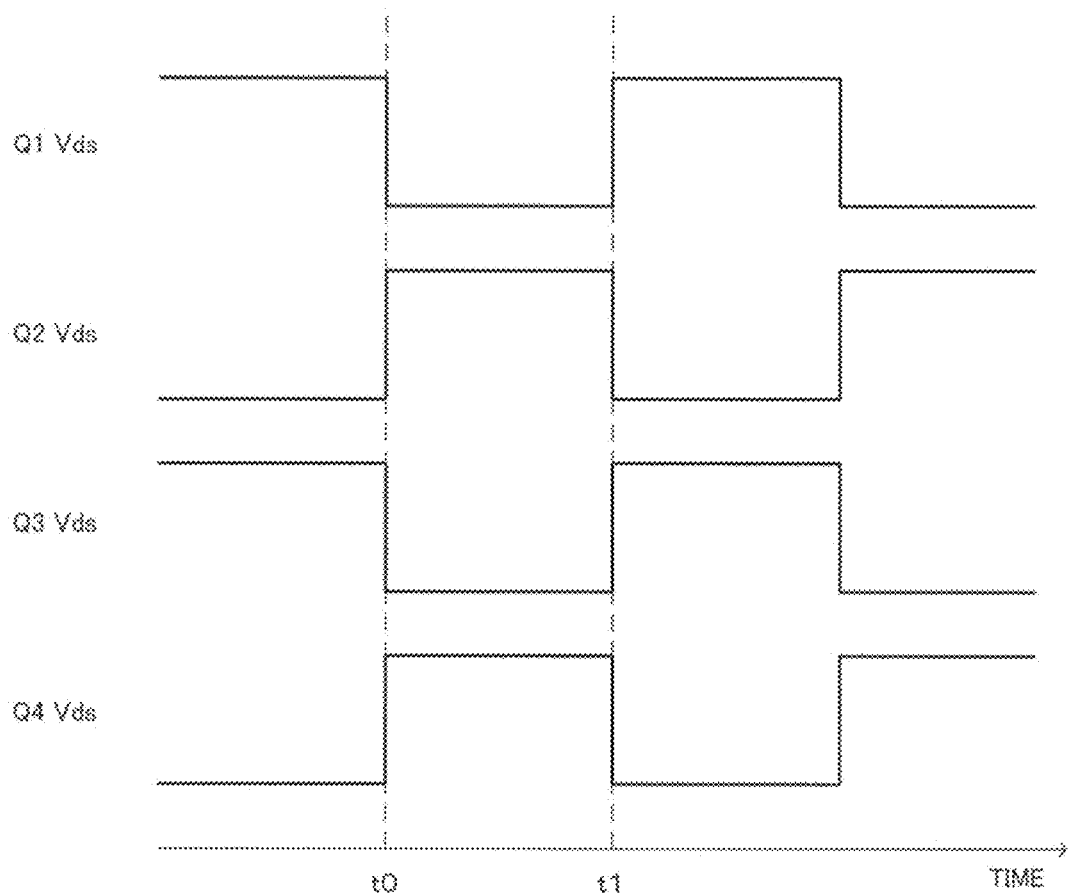
FIG. 3 is a timing chart for illustrating an example of ON/OFF control to be performed with respect to each switching element.

FIG. 3 is a timing chart for illustrating an example of ON/OFF control to be performed with respect to each switching element. Now, with reference to FIG. 3, description is specifically given of the example of the ON/OFF control to be performed by the control unit with respect to each of the switching elements 101 to 104.

In FIG. 3, "Q1" to "Q4" represent the switching elements 101 to 104, respectively. "Vds" represents a drain-source voltage. In this case, a period in which the voltage Vds is low (L) corresponds to an ON period in which the control unit applies a voltage to the gate. A period in which the voltage Vds is high (H) corresponds to an OFF period in which the control unit applies no voltage to the gate.

In view of the above, at a time t0, the switching elements 101 and 103 are turned off, and the switching elements 102 and 104 are turned off. After that, at a time t1, the switching elements 101 and 103 are turned off, and the switching elements 102 and 104 are turned on. Control for achieving such ON/OFF drive is repeatedly performed with respect to the switching elements 101 to 104.

Referring back to the description of FIG. 1, a capacitor 11 and a capacitor 12 are connected in series to each other between the terminals of the power source 201. A capacitor 13 has one end connected to the two capacitors 11 and 12, and the other end connected to the ground. The ground is, for example, a metal casing. Here, reference symbol 300 represents a connection point, that is, a node at which the capacitor 13 is connected to the ground. Reference symbol 301 represents a connection point between a positive line of the power source 201 and the capacitor 11, and reference symbol 302 represents a connection point between a negative line of the power source 201 and the capacitor 12. Reference symbol 303 represents a connection point among the capacitor 11, the capacitor 12, and the capacitor 13.

The capacitors 11 and 12 mainly function as capacitors for removing a normal mode noise present between lines. In view of the above, in the following, the capacitor 11 is also referred to as "first X capacitor 11", and the capacitor 12 is also referred to as "second X capacitor 12". The capacitor 13 is also referred to as "Y capacitor 13".

As described above, the switching elements 101 to 104 are subjected to ON/OFF drive. At timing to switch the operation of each of the switching elements 101 to 104, that is, at the time t0 and the time t1 of FIG. 3, a surge voltage V is generated due to a parasitic inductance L present on a current path including the connection point 301, the switching elements 101 to 104, and the connection point 302 in the stated order. This surge voltage V causes a common mode current. Therefore, the switching of the operation of each of the switching elements 101 to 104 is one factor to cause the common mode noise. The surge voltage V is expressed by the following expression:

$$V = L \times di/dt.$$

This common mode current flows through the Y capacitor 13 via the first X capacitor 11 and the second X capacitor 12. In order to avoid confusion, in the following, common mode currents are only assumed as currents flowing through the first X capacitor 11 and the second X capacitor 12.

A voltage Vcom1 between terminals of the first X capacitor 11, that is, a voltage to be generated between the connection points 301 and 303 can be obtained by the following expression:

$$V\text{com}1 = \tfrac{1}{2} \times V\text{in} \times Z\text{com}1/(Z\text{com}1 + Z\text{com}3),$$

where Zcom1 represents an impedance between the connection points 301 and 303 and Zcom3 represents an impedance between the connection points 303 and 300. Similarly, a voltage Vcom2 between terminals of the second X capacitor 12, that is, a voltage to be generated between the connection points 302 and 303 can be obtained by the following expression:

$$V\text{com}2 = \tfrac{1}{2} \times V\text{in} \times Z\text{com}2/(Z\text{com}2 + Z\text{com}3),$$

where Zcom2 represents an impedance between the connection points 302 and 303.

Next, a common mode current Icx1 flowing from the connection point 301 to the connection point 303 is expressed as follows:

$$I\text{cx}1 = \tfrac{1}{2} \times V\text{in} \times Z\text{com}1/(Z\text{com}1 + Z\text{com}3)/Z\text{com}1.$$

Similarly, a common mode current Icx2 flowing from the connection point 302 to the connection point 303 is expressed as follows:

$$I\text{cx}2 = -\tfrac{1}{2} \times V\text{in} \times Z\text{com}2/(Z\text{com}2 + Z\text{com}3)/Z\text{com}2.$$

A common mode current Icy flowing from the connection point 303 to the connection point 300 is expressed as follows:

$$I\text{cy} = I\text{cx}1 + I\text{cx}2.$$

In this manner, a voltage Vcom3 across the Y capacitor 13, which is a voltage between the connection points 303 and 300, is expressed as follows:

$$V\text{com}3 = I\text{cy} \times Z\text{com}3 = (I\text{cx}1 + I\text{cx}2)Z\text{com}3.$$

When a voltage between the connection points 301 and 300 is represented by Vo, the voltage Vo can be expressed as follows:

$$Vo = V\text{com}1 + V\text{com}3.$$

The first capacitor 11 and the Y capacitor 13 are connected in series to each other between the connection points 301 and 300, and hence the voltage Vo is divided so that the voltage Vcom3 across the Y capacitor 13 becomes lower than the voltage Vo. Therefore, as compared to the related art in which the voltage Vo is directly applied, the insulation resistance between the line and the ground can be ensured through use of a capacitor with a smaller rated voltage, in other words, a small-sized capacitor. When such a capacitor is adopted as the Y capacitor 13, further downsizing of the electric power converter 1 can be achieved more easily.

Figure 2:
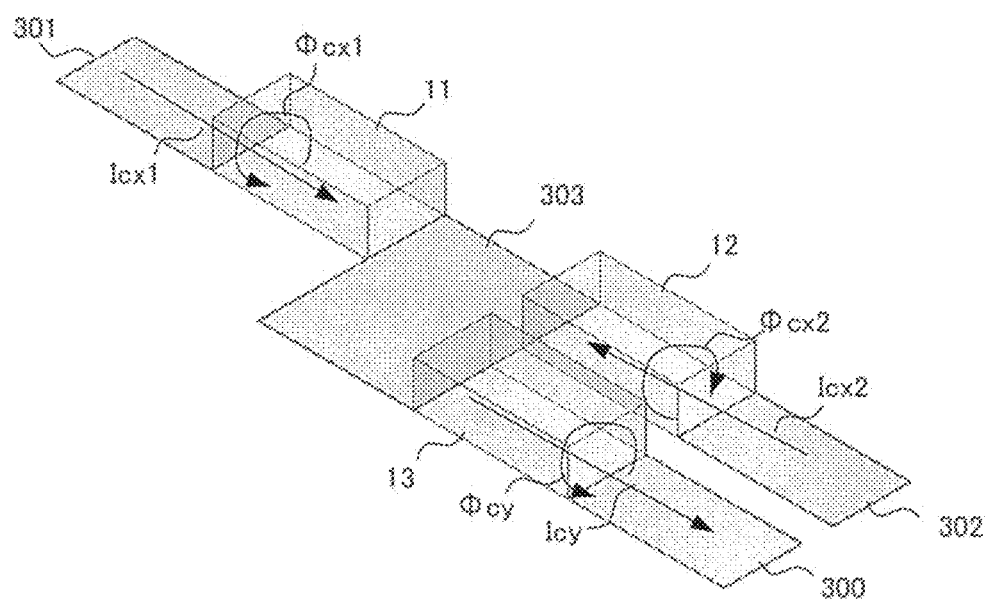
FIG. 2 is a diagram for illustrating an example of an arrangement of capacitors used in the electric power converter according to the first embodiment of the present invention.

FIG. 2 is a diagram for illustrating an example of the arrangement of the capacitors used in the electric power converter according to the first embodiment of the present invention. As illustrated in FIG. 2, the second X capacitor 12 and the Y capacitor 13 are arranged adjacent to each other, and arranged so that common mode currents flow therethrough in directions different from each other by 180 degrees or substantially 180 degrees. Therefore, a magnetic flux Φcy generated by the Y capacitor 13 due to the common mode current Icy acts to cancel a magnetic flux Φcx2 generated by the second X capacitor 12, although the magnetic flux Φcy hardly affects a magnetic flux Φcx1 generated by the first X capacitor 11. In FIG. 2, the common mode currents Icx1, Icx2, and Icy assumed in the capacitors 11 to 13, respectively, are represented by arrows. The direction of each of the arrows indicates the direction in which the corresponding common mode current flows. The same holds true in the other figures.

The second X capacitor 12 and the Y capacitor 13 are magnetically coupled to each other as described above, and hence a mutual inductance takes a negative value, and the impedances Zcom2 and Zcom3 become smaller. When the impedance Zcom3 becomes smaller, the voltage Vcom3 across the Y capacitor 13 also becomes smaller. As illustrated in FIG. 2, the first X capacitor 11 and the second X capacitor 12 are arranged so that the common mode currents Icx1 and Icx2 flow therethrough in directions different from each other by 180 degrees or substantially 180 degrees.

Figure 4:
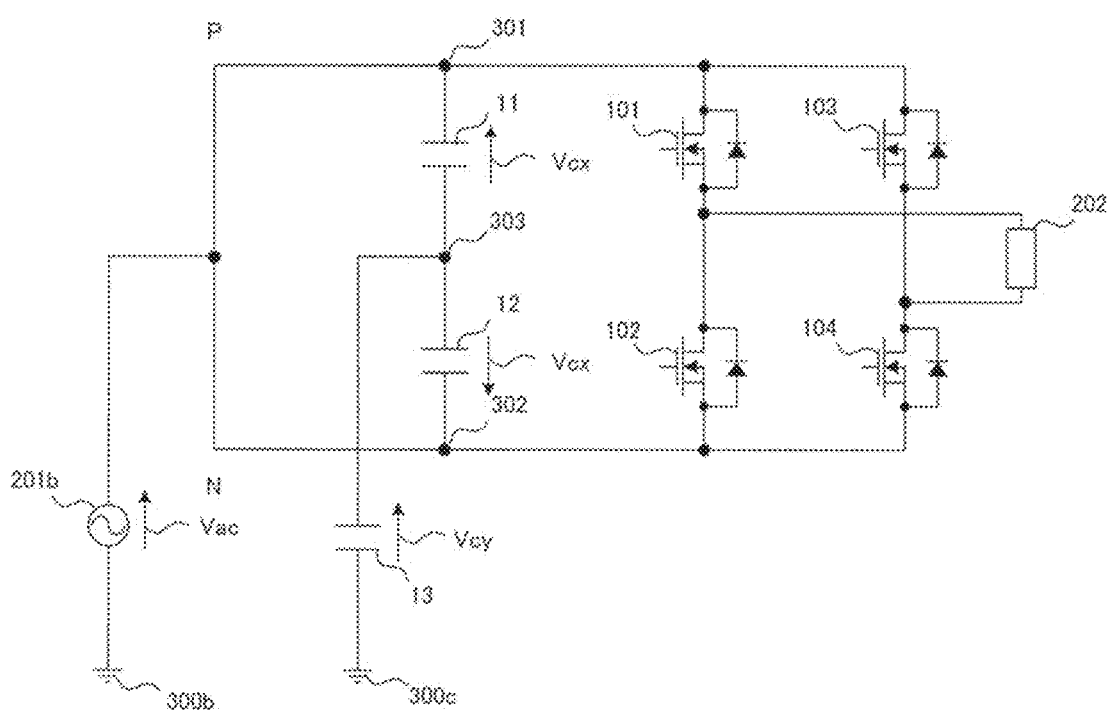
FIG. 4 is a diagram for illustrating an example of a configuration for an insulation resistance test between a line and the ground of the electric power converter according to the first embodiment of the present invention.

FIG. 4 is a diagram for illustrating an example of a configuration for an insulation resistance test between the line and the ground of the electric power converter according to the first embodiment of the present invention. This insulation resistance test is a test for conforming to GB/T 184488.1 or other laws and regulations. As illustrated in FIG. 4, in the insulation resistance test, an AC power source 201b configured to apply an AC voltage Vac is used in place of the power source 201. One end of the AC power source 201b is connected to another connection point 300b for grounding, and the other end thereof is connected to the connection points 301 and 302. The connection point 300 and the connection point 300c basically have the same potential.

When a frequency of the AC power source 201b is represented by fac, a capacitance of the first X capacitor 11 is represented by Cx1, and a capacitance of the second X capacitor 12 is represented by Cx2, a combined capacitance Cx of the first X capacitor 11 and the second X capacitor 12 is expressed as follows:

$$Cx = Cx1 + Cx2.$$

When a combined impedance of the first X capacitor 11 and the second X capacitor 12 is represented by Zcx, the combined impedance Zcx is expressed as follows:

$$Zcx = 1/(2 \times \pi \times fac \times Cx).$$

Similarly, when a capacitance of the Y capacitor 13 is represented by Cy, an impedance Zy of the Y capacitor 13 is expressed as follows:

$$Zy = 1/(2 \times \pi \times fac \times Cy).$$

A voltage Vcx across each of the first X capacitor 11 and the second X capacitor 12 is expressed as follows:

$$Vcx=Vac \times Zcx/(Zcx+Zy).$$

A voltage Vcy across the Y capacitor 13 is expressed as follows:

$$Vcy=Vac \times Zcy/(Zcx+Zy).$$

Therefore, the voltage Vcx across each of the X capacitors 11 and 12 and the voltage Vcy across the Y capacitor 13 are determined based on an impedance ratio calculated through use of the combined capacitance Cx of the X capacitors 11 and 12 and the capacitance Cy of the Y capacitor 13.

In view of the above, in the first embodiment, the voltage to be applied across the Y capacitor 13 can be controlled through the adjustment of the impedance ratio described above. Therefore, a capacitor having a smaller rated voltage, for example, a small-sized capacitor can be adopted as the Y capacitor 13 while the required insulating withstand voltage is ensured.

The electric power converter 1 to which the first embodiment is applied is an inverter device, but the type of the electric power converter 1 to which the first embodiment is applicable is not limited to the inverter device. That is, the first embodiment is applicable to various types of electric power converter 1. The electric power converter 1 may include an isolation transformer.

Further, the two capacitors 11 and 12 are connected in series to each other as X capacitors between lines, that is, between the connection points 301 and 302, but the number of X capacitors to be connected in series to each other may be three or more.

Second Embodiment

In the above-mentioned first embodiment, as illustrated in FIG. 2, the second X capacitor 12 and the Y capacitor 13 are arranged so that magnetic fluxes generated therefrom are canceled by each other. In the case of such an arrangement, even when the first X capacitor 11 and the second X capacitor 12 are formed to have the same capacitance, as described above, the impedance Zcom2 of the second X capacitor 12 becomes smaller than the impedance Zcom1 of the first X capacitor 11.

The common mode current icy flowing through the Y capacitor 13 is expressed as follows:

$$Icy=Icx1+Icx2=\tfrac{1}{2} \times Vin \times Zcom1/(Zcom1+Zcom3)/Zcom1-\tfrac{1}{2} \times Vin \times Zcom2/(Zcom2+Zcom3)/Zcom2.$$

Therefore, Icy≠0 is satisfied, and the common mode current Icy flows through the Y capacitor 13. When the common mode current Icy flows, the common mode noise is generated, and there is a fear in that noise performance is deteriorated. In view of the above, in a second embodiment of the present invention, the common mode current Icy is further suppressed. The reference symbols used in the above-mentioned first embodiment are directly used for the same parts as those of the above-mentioned first embodiment or parts corresponding to those of the above-mentioned first embodiment, and different parts are specifically described. The same holds true in other embodiments described later.

Figure 5:
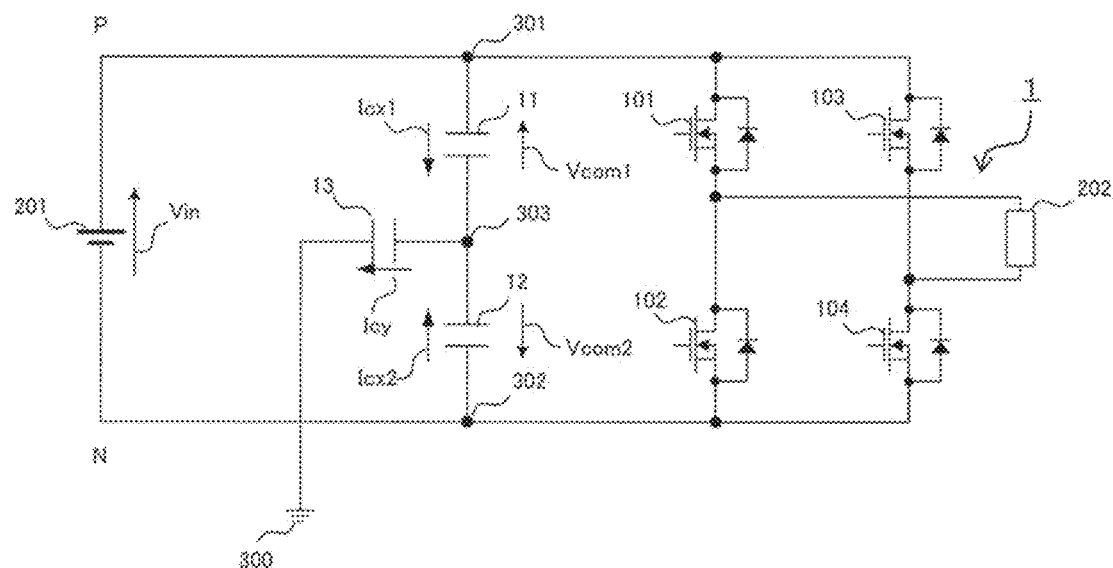
FIG. 5 is a diagram for illustrating an example of circuit configuration of an electric power converter according to a second embodiment of the present invention.
Figure 6:
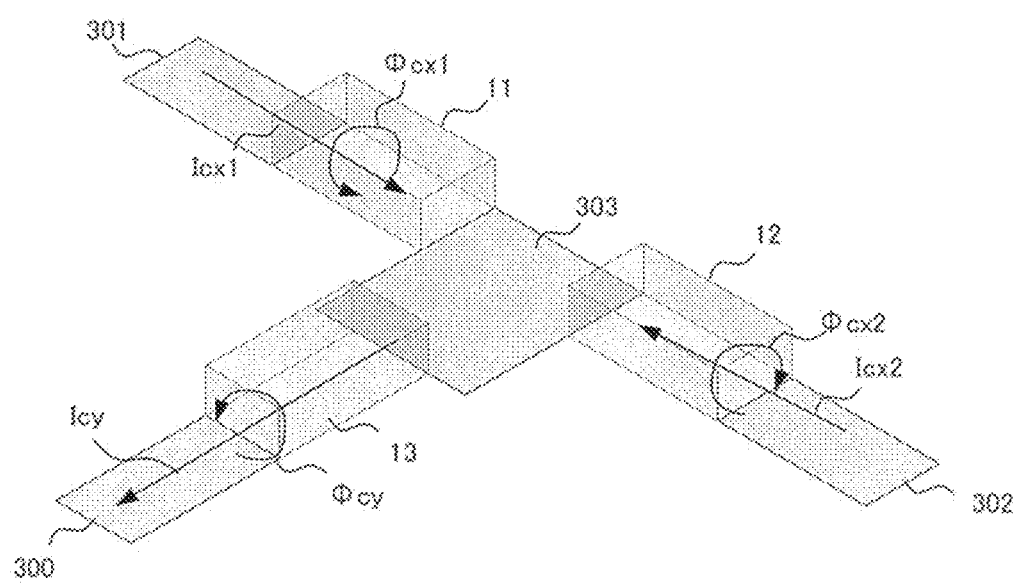
FIG. 6 is a diagram for illustrating an example of an arrangement of capacitors used in the electric power converter according to the second embodiment of the present invention.

FIG. 5 is a diagram for illustrating an example of a circuit configuration of an electric power converter according to the second embodiment of the present invention, and FIG. 6 is a diagram for illustrating an example of an arrangement of capacitors used in the electric power converter according to the second embodiment of the present invention.

As illustrated in FIG. 5 and FIG. 6, in the second embodiment, similarly to the above-mentioned first embodiment, the first X capacitor 11 and the second X capacitor 12 are arranged so that the assumed common mode currents Icx1 and Icx2 flow therethrough in directions different from each other by 180 degrees or substantially 180 degrees. In other words, the Y capacitor 13 is arranged so that the common mode current Icy flows therethrough in a direction different from the direction of each of the common mode currents Icx1 and Icx2 by 90 degrees or substantially 90 degrees in absolute value.

When the capacitors 11 to 13 are arranged as described above, the magnetic fluxes Φcx1, Φcx2, and Φcy generated by the respective capacitors 11 to 13 do not interfere with each other or hardly interfere with each other. Therefore, the impedances Zcom1 to Zcom3 of the respective capacitors 11 to are also not changed or hardly changed by the mutual inductance. Therefore, when the first X capacitor 11 and the second X capacitor 12 are formed to have equal capacitances, even at the time of variation of a voltage between the connection points 301 and 302, the flow of the common mode current Icy can be avoided or suppressed.

When the flow of the common mode current Icy is suppressed, the common mode noise is also suppressed. Therefore, as compared to the above-mentioned first embodiment, higher noise performance can be achieved. As described above, the voltage between the connection points 301 and 302 varies due to, for example, switching between ON and OFF of each of the switching elements 101 to 104.

Third Embodiment

Figure 7:
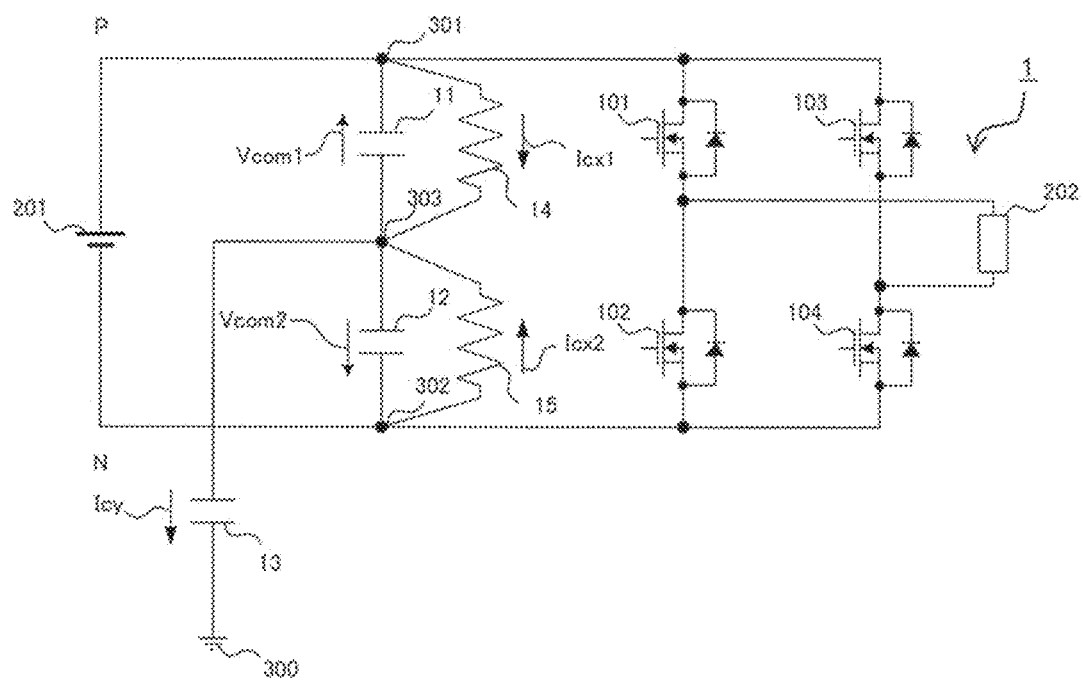
FIG. 7 is a diagram for illustrating an example of a circuit configuration of an electric power converter according to a third embodiment of the present invention.

FIG. 7 is a diagram for illustrating an example of a circuit configuration of an electric power converter according to a third embodiment of the present invention. In the third embodiment, as illustrated in FIG. 7, a first resistor 14 and a second resistor 15 are connected in parallel to the first X capacitor 11 and the second X capacitor 12, respectively. In other words, the first X capacitor 11 and the first resistor 14 are connected in parallel to each other between the connection points 301 and 303, and the second X capacitor 12 and the second resistor 15 are connected in parallel to each other between the connection points 303 and 302.

When a resistance value, that is, an impedance of the first resistor 14 is represented by Rx1, and a frequency at which the voltage between the connection points 301 and 302 varies, that is, a switching frequency is represented by f, an impedance Zcom13 between the connection points 301 and 303 is expressed as follows:

$$Zcom13=Rx1 \times Zcom1/(Rx1+Zcom1)=Rx1(2\pi \times f \times Cx1)/(Rx1+(2\pi \times f \times Cx1)).$$

Similarly, when a resistance value, that is, an impedance of the second resistor 15 represented by Rx2, an impedance Zcom23 between the connection points 302 and 303 is expressed as follows:

$$Zcom23=Rx2 \times Zcom2/(Rx2+Zcom2)=Rx2(2\pi \times f \times Cx2)/(Rx2+(2\pi \times f \times Cx2)).$$

A voltage Vcom1 between the connection points 301 and 303 is expressed as follows:

Vcom1=½×Vin×Zcom13/(Zcom13+Zcom3). A voltage Vcom2 between the connection points 302 and 303 is expressed as follows:

$$Vcom2=\tfrac{1}{2} \times Vin \times Zcom23/(Zcom23+Zcom3).$$

Next, a common mode current Icx1 flowing from the connection point 301 to the connection point 303 is expressed as follows:

$$Icx1=\tfrac{1}{2}\times Vin\times Zcom13/(Zcom13+Zcom3)/Zcom13.$$

A common mode current Icx2 flowing from the connection point 302 to the connection point 303 is expressed as follows:

$$Icx2=-\tfrac{1}{2}\times Vin\times Zcom23/(Zcom23+Zcom3)/Zcom23.$$

A common mode current Icy flowing from the connection point 303 to the connection point 300 is expressed as follows:

$$Icy=Icx1+Icx2=\tfrac{1}{2}\times Vin\times Zcom13/(Zcom13+Zcom3)/Zcom13-\tfrac{1}{2}\times Vin\times Zcom23/(Zcom23+Zcom3)/Zcom23.$$

In the above-mentioned first embodiment, it is assumed that the impedance Zcom1 and the impedance Zcom2 are dependent, on only the first X capacitor 11 and the second X capacitor 12, respectively. Under this assumption, the impedances Zcom1 and Zcom2 vary in accordance with the local change of the frequency f, for example, the change of the voltage between the connection points 301 and 302.

In contrast, in the third embodiment, the first resistor 14 and the second resistor 15 are connected in parallel to the first X capacitor 11 and the second X capacitor 12, respectively. Because of the resistance values Rx1 and Rx2 that the first and second resistors 14 and 15 respectively have as impedances, ratios of variation of the impedances Zcom1 and Zcom2, which is caused in accordance with the local change of the frequency become smaller as compared to those in the above-mentioned first embodiment. Therefore, as compared to the above-mentioned first embodiment, the common mode current Icy can be more reliably suppressed.

Similarly to the above-mentioned second embodiment, the Y capacitor 13 may be arranged so that the common mode current icy flows therethrough in a direction different from the direction of the common mode current flowing through each of the first X capacitor 11 and the second X capacitor 12 by 90 degrees or substantially 90 degrees in absolute value. That is, the Y capacitor 13 may be arranged so that an angle formed between the direction of the common mode current Icy and the direction of the common mode current flowing through each of the first X capacitor 11 and the second X capacitor 12 is 90 degrees or substantially 90 degrees in absolute value. A plurality of first resistors 14 and a plurality of second resistors 15 may be used to achieve multi-series or multi-parallel connection.

Fourth Embodiment

Figure 8:
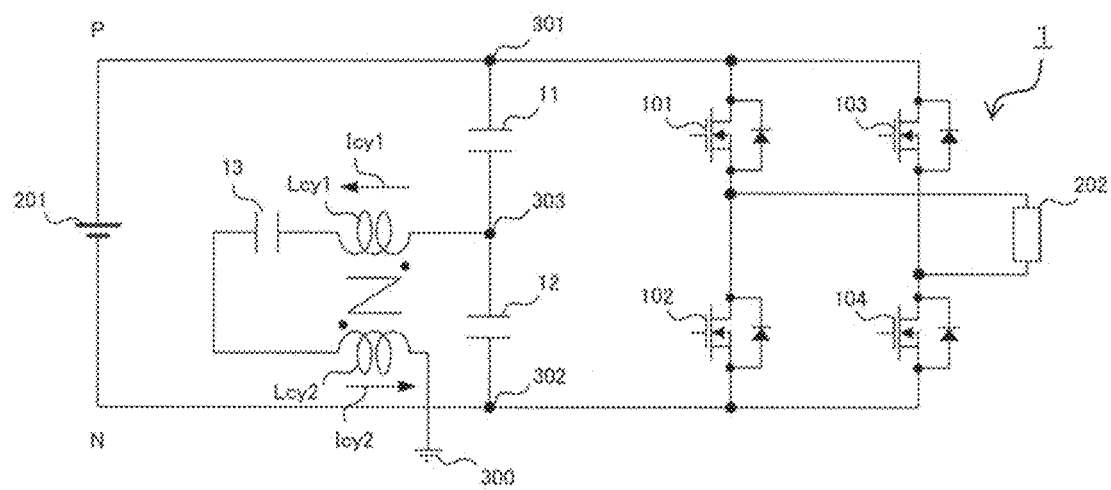
FIG. 8 is a diagram for illustrating an example of circuit configuration of an electric power converter according to a fourth embodiment of the present invention.
Figure 9:
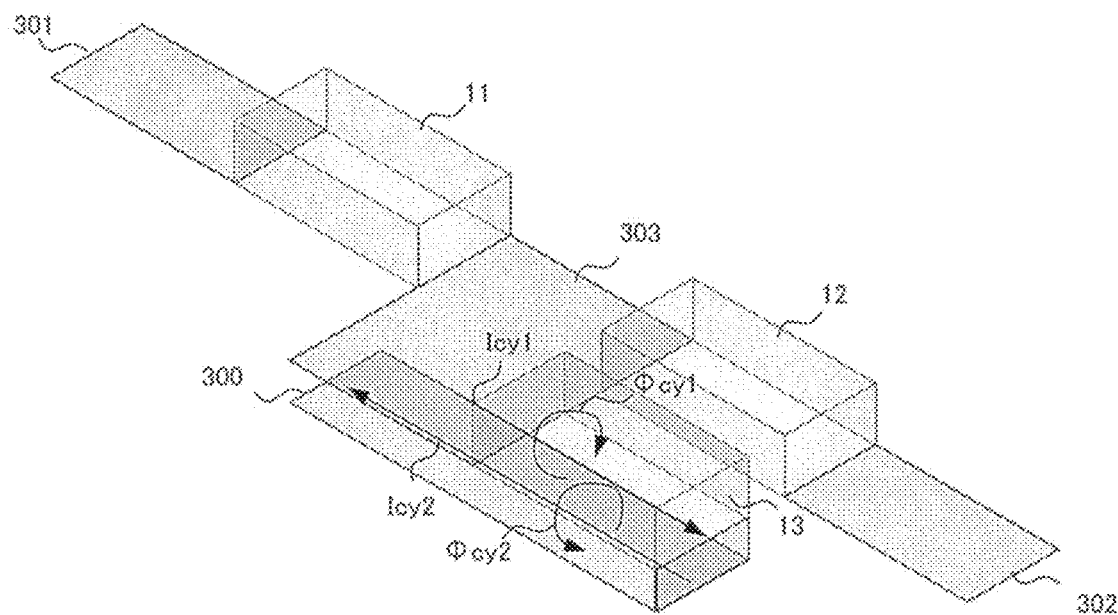
FIG. 9 is a diagram for illustrating an example of an arrangement of capacitors used in the electric power converter according to the fourth embodiment of the present invention.

FIG. 8 is a diagram for illustrating an example of circuit configuration of an electric power converter according to a fourth embodiment of the present invention, and FIG. 9 is a diagram for illustrating an example of an arrangement of capacitors used in the electric power converter according to the fourth embodiment of the present invention.

In FIG. 8, Lcy1 represents, for example, an inductance from the connection point 303 to the Y capacitor 13, and includes parasitic inductances of a metal conductor and the Y capacitor 13. Lcy2 represents, for example, an inductance of a metal conductor from the Y capacitor 13 to the connection point 300.

In the fourth embodiment, as illustrated FIG. 9, the metal conductors and the Y capacitor 13 corresponding to the inductances Lcy1 and Lcy2 are arranged so that a common mode current Icy1 flowing through the inductance Lcy1 and a common mode current Icy2 flowing through the inductance Lcy2 flow in directions different from each other by 180 degrees or substantially 180 degrees. In other words, a current path including the Y capacitor 13 and the metal conductors, which is present between the connection points 303 and 300, is divided into two partial paths, which are arranged to achieve the inductances Lcy1 and Lcy2 through which the assumed common mode currents Icy1 and Icy2 flow in different directions. With this configuration, magnetic fluxes Φcy1 and Φcy2 generated by the common mode currents Icy1 and Icy2, respectively, act so as to cancel each other. As result, because of the mutual inductance, an effective inductance between the connection points 303 and 300 becomes smaller, and a filter effect with respect to the common mode noise can be further improved.

Each of the capacitors 11 to 13 is mounted on a substrate (not shown). The substrate is a multi-layer substrate. In FIG. 9, the position of the Y capacitor 13 through which the common mode current Icy1 flows and the position of the metal conductor through which the common mode current Icy2 flows are shifted in the vertical direction when FIG. 9 is faced. This indicates that the metal conductor through which the common mode current Icy2 flows is arranged in a layer lower than a surface on which the Y capacitor 1 is mounted. The same holds true in the other figures.

Figure 10:
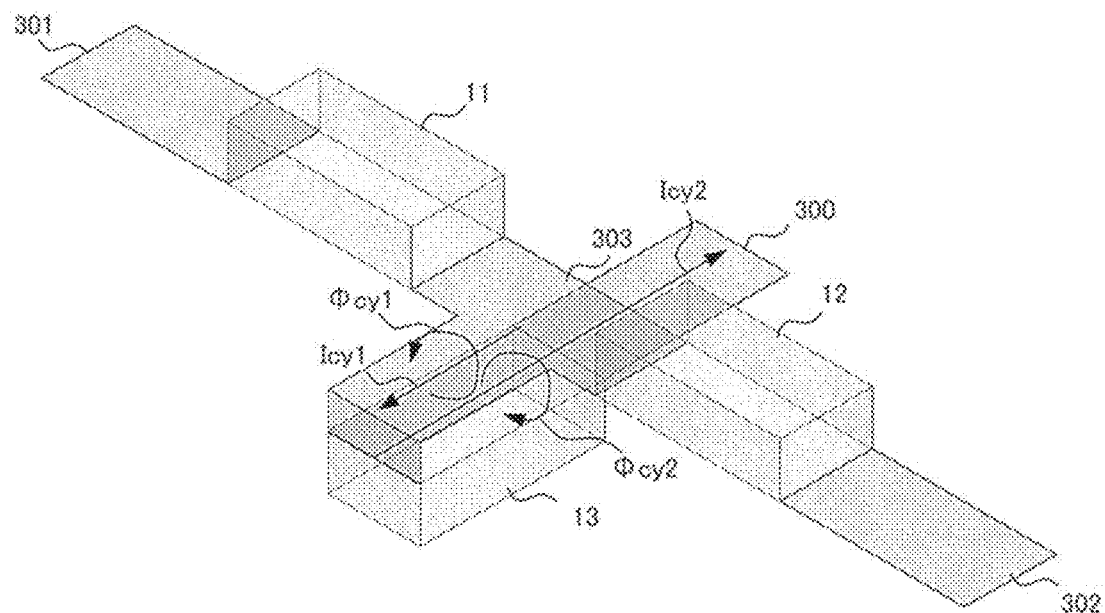
FIG. 10 is a diagram for illustrating a modification example of the arrangement of the capacitors used in the electric power converter according to the fourth embodiment of the present invention.

As illustrated in FIG. 10, Lcy1 may represent an inductance of a metal conductor from the connection point 303 to the Y capacitor 13, and Lcy2 may represent a parasitic inductance of the Y capacitor 13 and an inductance of the metal conductor from the Y capacitor 13 to the connection point 300. Also in this case, the common mode currents Icy1 and Icy2 are caused to flow in directions different from each other by 180 degrees or substantially 180 degrees. As a result, the magnetic fluxes Φcy1 and Φcy2 generated by the respective common mode currents Icy1 and Icy2 act so as to cancel each other. Therefore, the effective inductance between the connection points 303 and 300 becomes smaller, and the filter effect with respect to the common mode noise is further improved.

Figure 11:
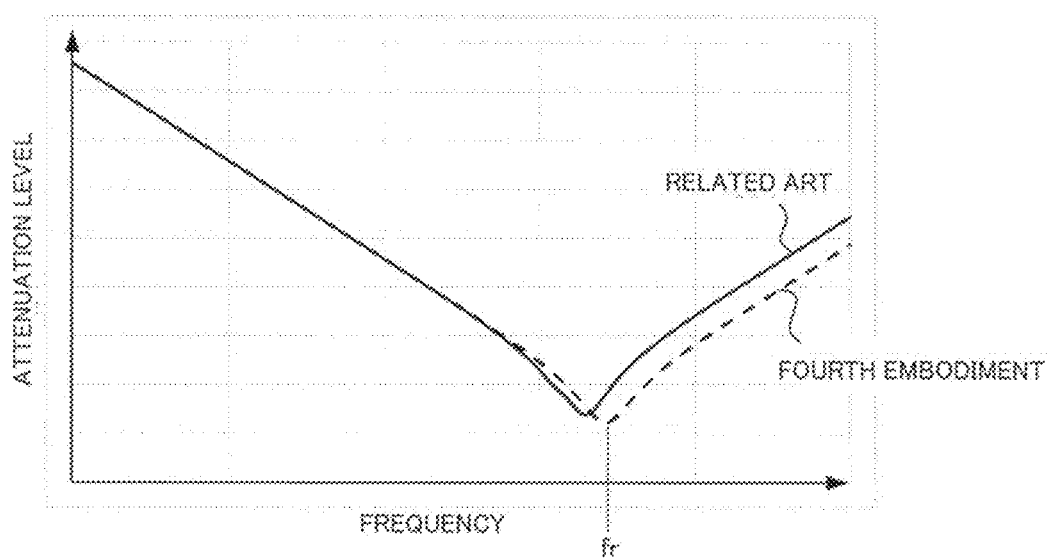
FIG. 11 is a graph for showing an example of a filter characteristic depending on frequency.

FIG. 11 is a graph for showing an example of a filter characteristic depending on frequency. Next, with reference to FIG. 11, the filter characteristic in the fourth embodiment is specifically described.

In FIG. 11, the horizontal axis represents frequency, and the vertical axis represents attenuation level. A smaller attenuation level indicates a superior filter characteristic. The solid line indicates a filter characteristic in an electric power converter of the related art, and the broken line indicates the filter characteristic in the fourth embodiment. A resonance frequency, which is denoted by fr, is expressed as follows through use of a capacitance Cy of the Y capacitor 13 and a parasitic inductance Ly thereof:

$$fr=1/(2\times\pi\times(Ly\times Cy)^{1/2}).$$

As described above, in the fourth embodiment, the impedance between the connection points 303 and 300 becomes smaller because the magnetic fluxes Φcy1 and Φcy2 are generated so as to cancel each other even when the capacitance Cy, the shape of the Y capacitor 13, and the metal conductor shape are all the same. Therefore, the resonance frequency fr is shifted to a higher frequency than that in the related art. As a result, as shown in FIG. 11, the filter effect is improved in a region of a relative high frequency. It is thus found that the fourth embodiment is effective to achieve a higher frequency in the electric power converter 1.

Figure 12:
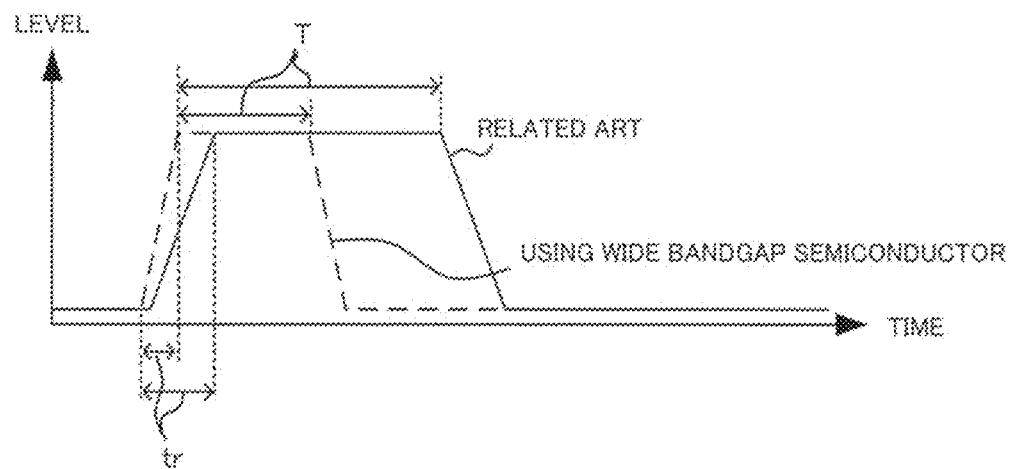
FIG. 12 is a graph for showing an example of ON/OFF drive of a wide gap semiconductor.
Figure 13:
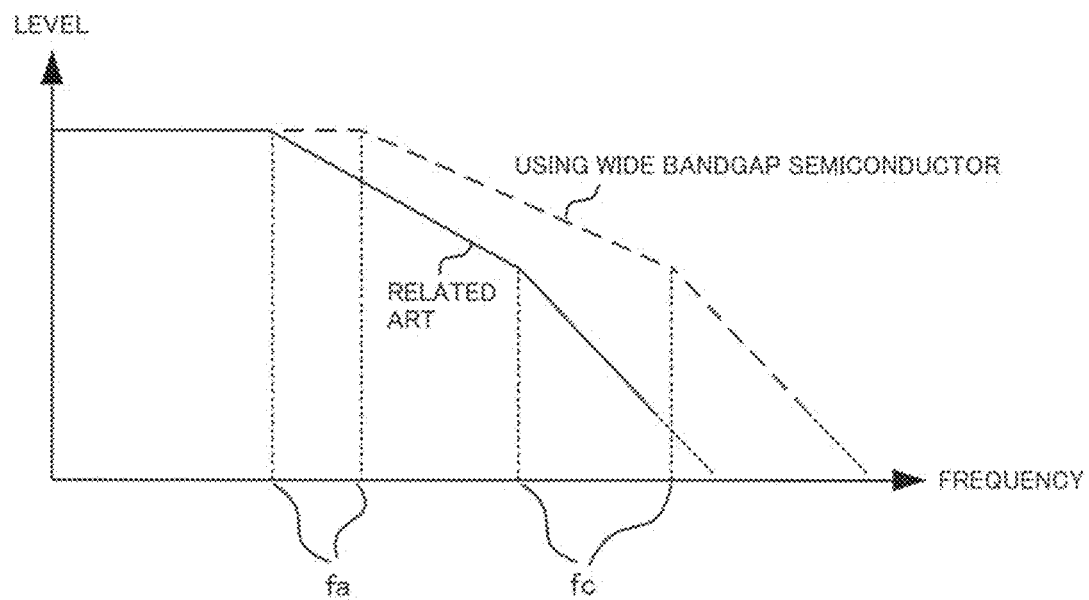
FIG. 13 is a graph for showing an example of a frequency characteristic obtained when the wide gap semiconductor is adopted as a switching element.

FIG. 12 is a graph for showing an example of ON/OFF drive of a wide gap semiconductor, and FIG. 13 is a graph for showing an example of a frequency characteristic obtained when the wide gap semiconductor is adopted as a switching element. Now, the electric power converter 1 of a case in which the wide gap semiconductor is adopted as each of the switching elements 101 to 104 is specifically described. In FIG. 12 and FIG. 13, the wide gap semiconductor is expressed as "wide band gap semiconductor".

In FIG. 12, the horizontal axis represents time, and the vertical axis represents signal level. In FIG. 13, the horizontal axis represents frequency, and the vertical axis represents attenuation level. In both of FIG. 12 and FIG. 13, the solid line indicates the related art, that is, a case in which a semiconductor using silicon or other materials is adopted, and the broken line indicates a case in which a wide gap semiconductor is adopted.

The wide gap semiconductor is a semiconductor having a relatively wide bandgap, and has such a physical property that values of thermal conductivity, electron velocity, dielectric breakdown electric field strength, and the like are high. Because of its superior physical property, in recent years, the wide gap semiconductor is greatly expected to contribute to significant downsizing and increase in efficiency of equipment.

Because of its superior physical property, as shown in FIG. 12, the wide gap semiconductor allows drive in higher speed and higher frequency. However, as the frequency becomes higher, a pulse application time period T and a pulse rising time period tr become shorter.

Meanwhile, as shown in FIG. 13, the signal level of the wide gap semiconductor is greatly improved in a high frequency region as compared to that of the related art. Both of a frequency fa at which the signal level starts to attenuate at 20 dB/decade and a frequency fc at which the signal level starts to attenuate at 40 dB/decade are greatly shifted to a higher frequency side in the wide gap semiconductor as compared to the related art. The frequency fa is expressed as follows:

$$fa=1/(\pi \times T).$$

The frequency fc is expressed as follows:

$$fc=1/(\pi \times tr).$$

In this manner, as the pulse application time period T becomes shorter, the frequency fa becomes higher, and as the pulse rising time period tr becomes shorter, the frequency fc becomes higher.

The wide gap semiconductor has such a frequency characteristic, and hence when the fourth embodiment is applied to the electric power converter 1 in which the wide gap semiconductor is adopted as each of the switching elements 101 to 104, a further noise reduction effect can be obtained due to the improved filter effect. Therefore, when the wide gap semiconductor is adopted as each of the switching elements 101 to 104, further downsizing of the electric power converter 1 can be achieved more easily while the insulation resistance between the line and the ground is ensured. The electric power converter 1 is desired to have a higher frequency, and hence the wide gap semiconductor may be adopted as each of the switching elements 101 to 104 in the above-mentioned first to third embodiments.

Fifth Embodiment

Figure 14:
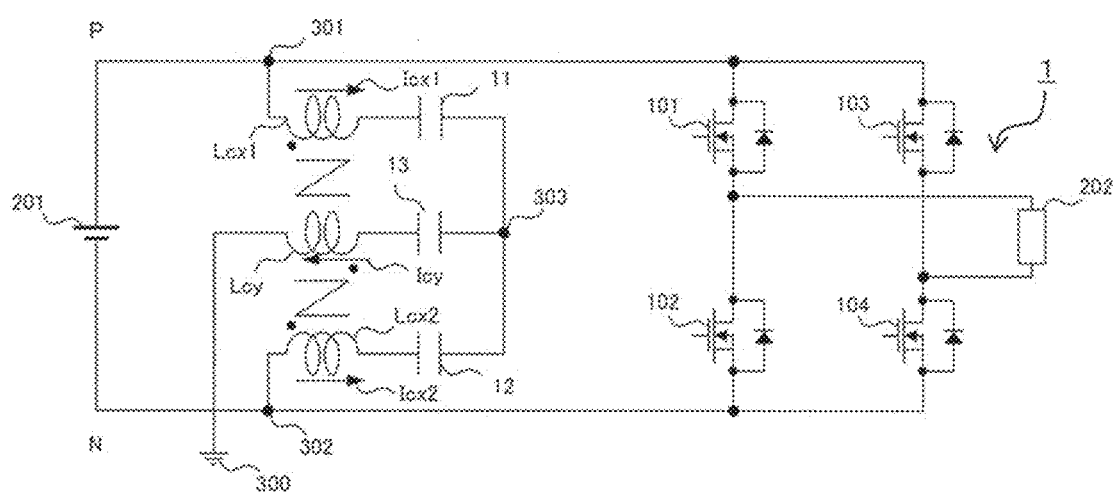
FIG. 14 is a diagram for illustrating an example of a circuit configuration of as electric power converter according to a fifth embodiment of the present invention.
Figure 15:
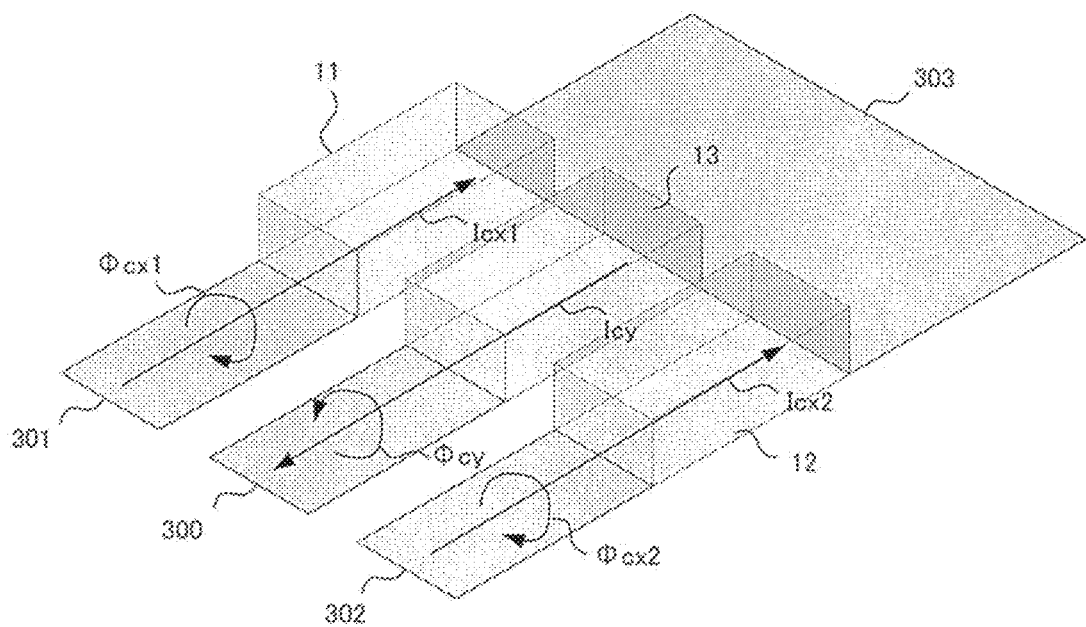
FIG. 15 is a diagram for illustrating an example of an arrangement of capacitors used in the electric power converter according to the fifth embodiment of the present invention.

FIG. 14 is a diagram for illustrating an example of a circuit configuration of an electric power converter according to a fifth embodiment of the present invention, and FIG. 15 is a diagram for illustrating an example of an arrangement of capacitors used in the electric power converter according to the fifth embodiment of the present invention.

In FIG. 14, Lcx1 represents an inductance from the connection point 301 to the connection point 303, and includes parasitic inductances of a metal conductor and the first X capacitor 11. Lcx2 represents an inductance from the connection point 302 to the connection point 303, and includes parasitic inductances of a metal conductor and the second X capacitor 12. Lcy is an inductance from the connection point 303 to the connection point 300, and includes parasitic inductances of a metal conductor and the Y capacitor 13.

In the fifth embodiment, as illustrated in FIG. 15, the common mode current Icx1 flowing through the inductance Lcx1 and the common mode current Icy flowing through the inductance Lcy are caused to flow in directions different from each other by 180 degrees or substantially 180 degrees. Further, the common mode current Icx2 flowing through the inductance Lcx2 and the common mode current Icy flowing through the inductance Lcy are caused to flow in directions different from each other by 180 degrees or substantially 180 degrees. The first X capacitor 11, the second X capacitor 12, the Y capacitor 13, and the metal conductors are arranged so as to satisfy the relationships of the directions of the common mode currents Icx1, Icx2, and Icy.

Therefore, as illustrated in FIG. 15, the magnetic flux Φcx1 caused by the common mode current Icx1 and the magnetic flux Φcy caused by the common mode current Icy act so as to cancel the magnetic fluxes by each other. Further, the magnetic flux Φcx2 caused by the common mode current Icx2 and the magnetic flux Φcy caused by the common mode current Icy act so as to cancel the magnetic fluxes by each other. As a result, because of the mutual inductance, both of an effective inductance between the connection points 301 and 300 and an effective inductance between the connection points 302 and 300 become smaller, and the filter effect with respect to the common mode noise can be further improved.

Sixth Embodiment

Figure 16:
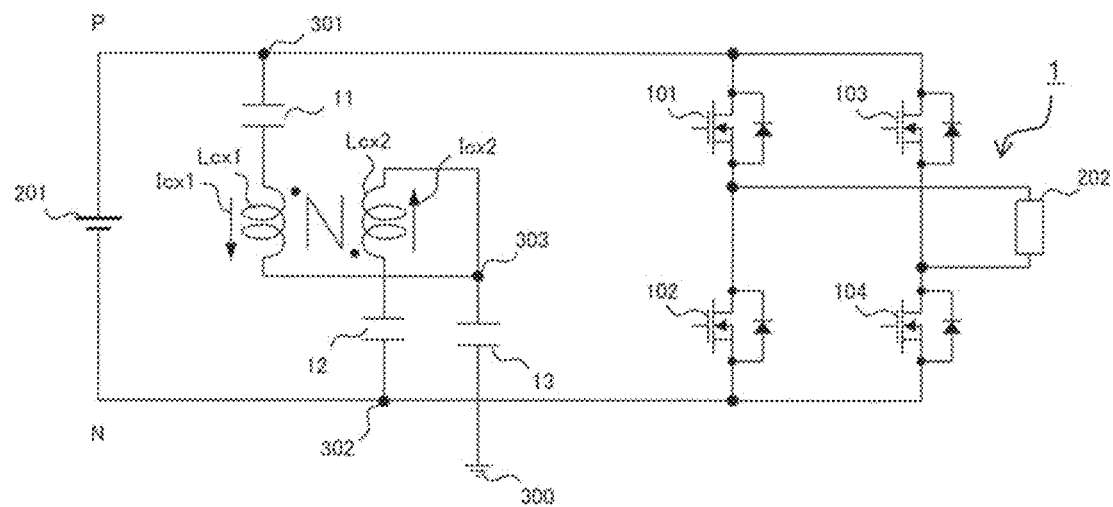
FIG. 16 is a diagram for illustrating an example of a circuit configuration of an electric power converter according to a sixth embodiment of the present invention.
Figure 17:
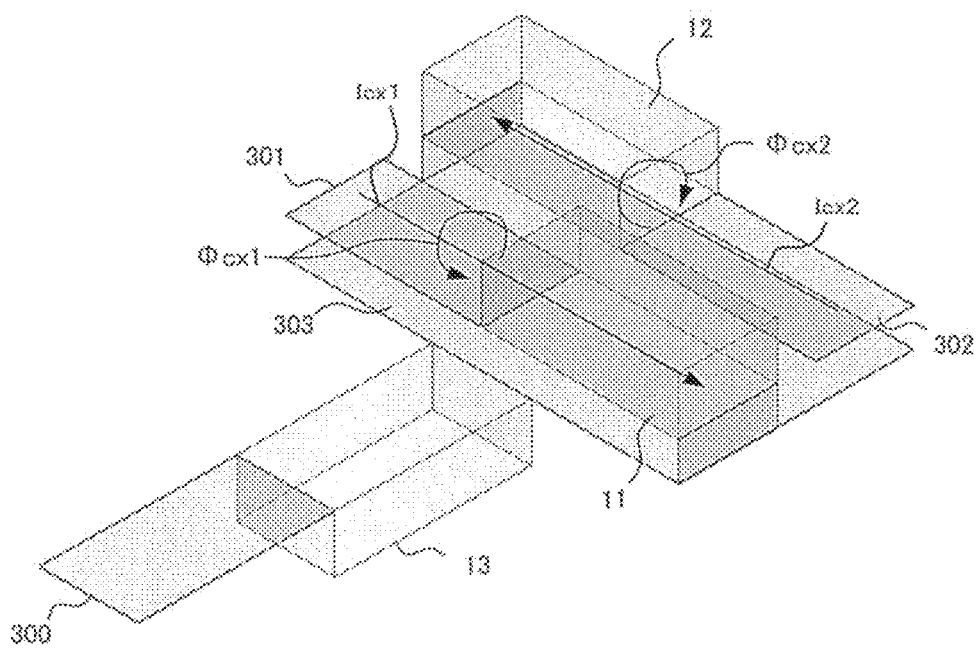
FIG. 17 is a diagram for illustrating an example of an arrangement of capacitors used in the electric power converter according to the sixth embodiment of the present invention.

FIG. 16 is a diagram for illustrating an example of circuit configuration or an electric power converter according to a sixth embodiment of the present invention, and FIG. 17 is a diagram for illustrating an example of an arrangement of capacitors used in the electric power converter according to the sixth embodiment of the present invention.

In FIG. 16, Lcx1 represents an inductance from the connection point 301 to the connection point 303, and includes parasitic inductances of a metal conductor and the first X capacitor 11. Lcx2 represents an inductance from the connection point 302 to the connection point 303, and includes parasitic inductances of a metal conductor and the second X capacitor 12.

In the sixth embodiment, the common mode current Icx1 flowing through the inductance Lcx1 and the common mode current Icx2 flowing through the inductance Lcx2 are caused to flow in directions different from each other by 180 degrees or substantially 180 degrees. The first X capacitor 11, the second X capacitor 12, and the metal conductors are arranged so as to satisfy the relationships of those directions.

Therefore, the magnetic flux ΦCx1 caused by the common mode current Icx1 and the magnetic flux ΦCx2 caused by the common mode current Icx2 act so as to cancel the magnetic fluxes by each other. As a result, because of the mutual inductance, both of an effective inductance between the connection points 301 and 303 and an effective inductance between the connection points 302 and 303 become smaller, and the filter effect with respect to the common mode noise can be further improved.

Seventh Embodiment

Figure 18:
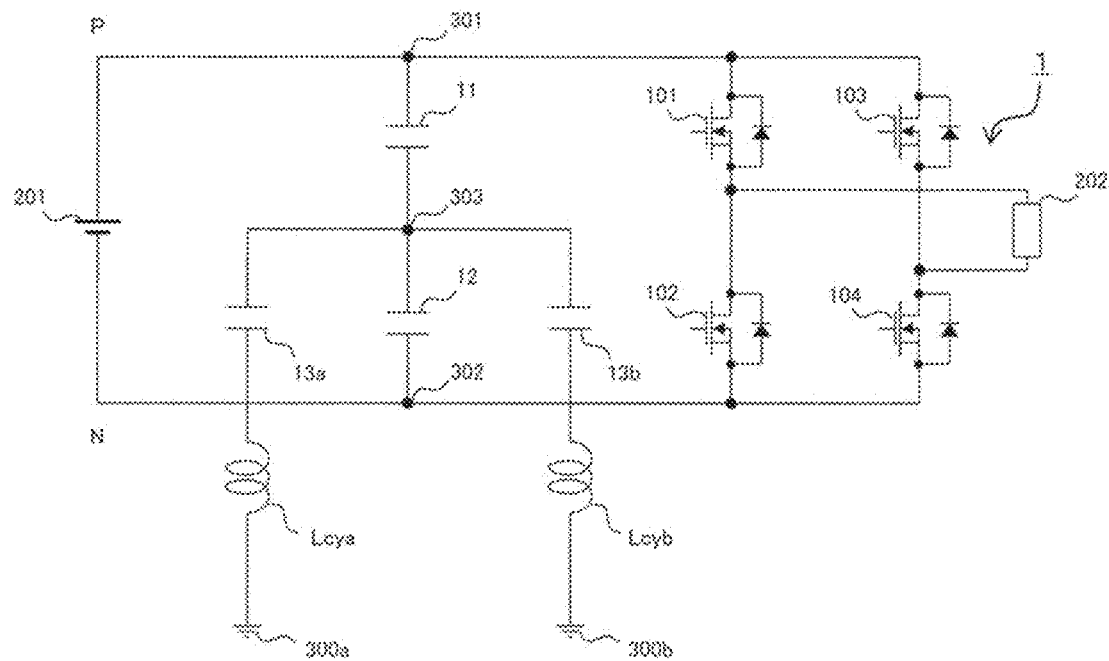
FIG. 18 is a diagram for illustrating an example of a circuit configuration of an electric power converter according to a seventh embodiment of the present invention.
Figure 19:
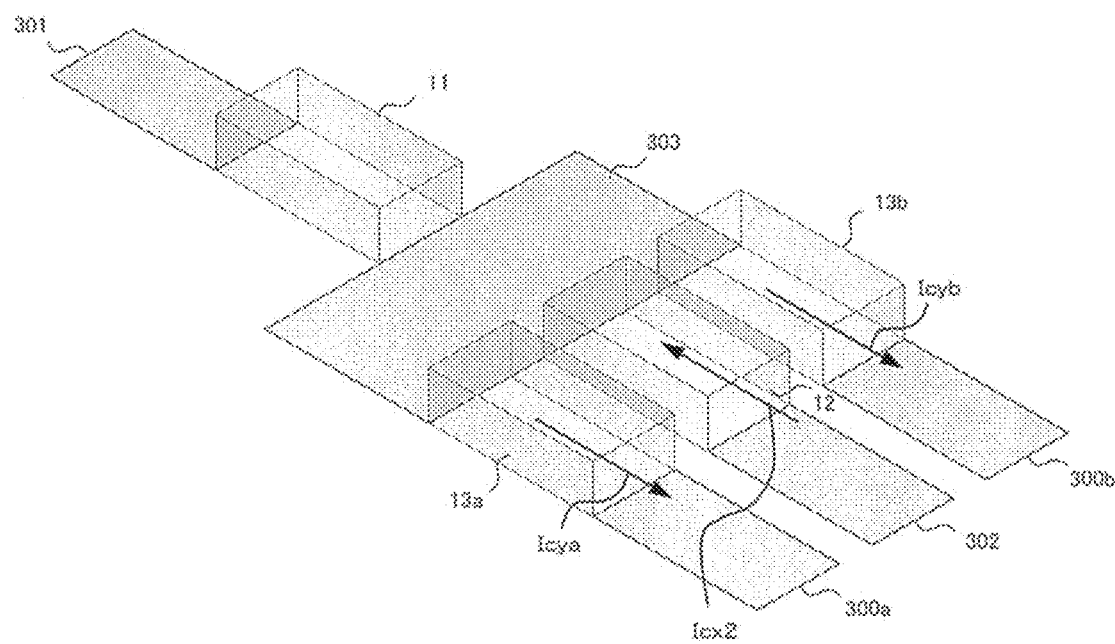
FIG. 19 is a diagram for illustrating an example of an arrangement of capacitors used in the electric power converter according to the seventh embodiment of the present invention.

FIG. 18 is a diagram for illustrating an example of a circuit configuration of an electric power converter according to a seventh embodiment of the present invention, and FIG. 19 is a diagram for illustrating an example of an arrangement of capacitors used in the electric power converter according to the seventh embodiment of the present invention.

In the seventh embodiment, as illustrated in FIG. 18, the connection point 303 is connected to one end of a first Y capacitor 13a and one end of a second Y capacitor 13b. The other end of the first Y capacitor 13a is connected to a connection point 300a for grounding. The other end of the second Y capacitor 13b is connected to another connection point 300b for grounding.

The connection point 300a and the connection point 300b basically have the same potential. However, the potential varies due to the common mode noise, and a potential difference may be caused between the connection points 300a and 300b. The capacitors 13a and 13b are connected to different connection points 300a and 300b to suppress the influence of the common mode noise to be caused by the variation of the potential.

Lcya represents an inductance between the connection points 303 and 300a, and includes parasitic inductances of a metal conductor and the first Y capacitor 13a. Lcyb represents an inductance between the connection points 303 and 300b, and includes parasitic inductances of a metal conductor and the second Y capacitor 13b.

In the seventh embodiment, as illustrated in FIG. 18, the first Y capacitor 13a and the second Y capacitor 13b are connected in parallel to each other between the connection point 303 and the ground. Therefore, the combined inductance Lcy between the connection point 303 and the ground is expressed as follows:

$$Lcy=Lcya \times Lcyb/(Lcya+Lcyb).$$

Thus, the combined inductance Lcy becomes smaller. Therefore, the filter effect with respect to the common mode noise is further improved.

Further, in the seventh embodiment, as illustrated in FIG. 19, a common mode current Icya flowing through the inductance Lcya and the common mode current Icx2 flowing between the connection points 302 and 303 are caused to flow in directions different from each other by 180 degrees or substantially 180 degrees. Further, a common mode current Icyb flowing through the inductance Lcyb and the common mode current Icx2 are caused to flow in directions different from each other by 180 degrees or substantially 180 degrees. In this manner, the filter effect with respect to the common mode noise is further improved.

In the seventh embodiment, the two capacitors 13a and 13b are used as the Y capacitors, but the number of Y capacitors may be three or more. The Y capacitors may be connected in parallel to each other, or two or more Y capacitors may be connected in series to each other. In views of those points as well, various modifications can be made.

Eighth Embodiment

Figure 20:
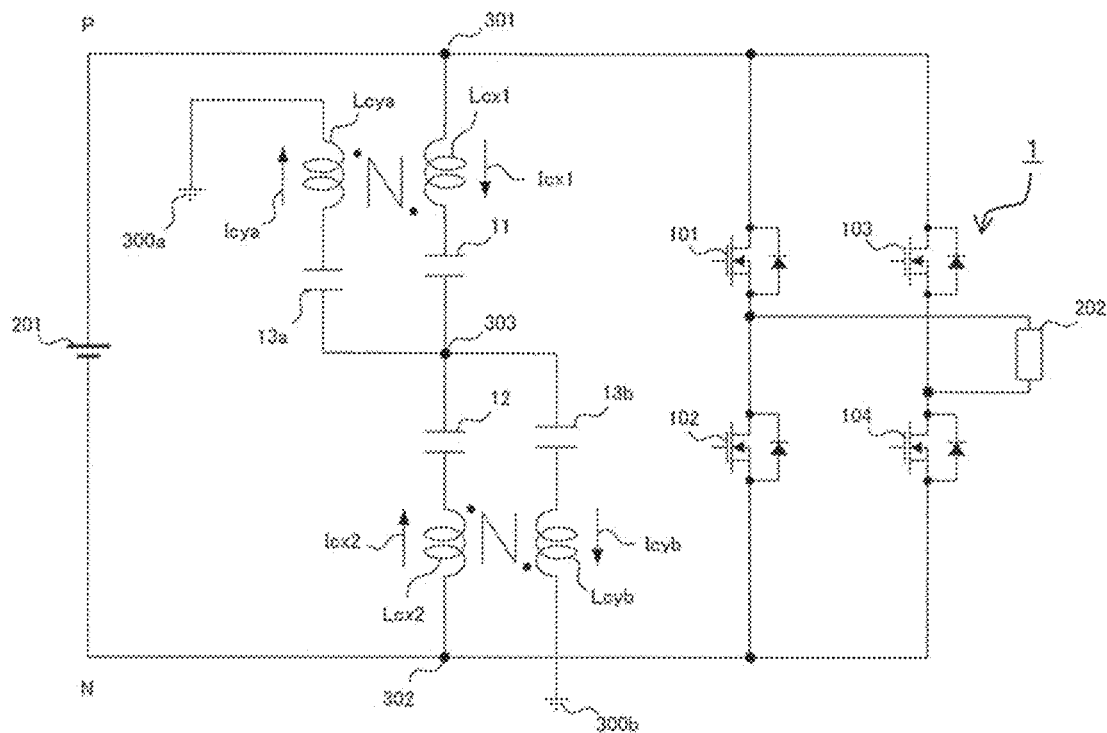
FIG. 20 is a diagram for illustrating an example of a circuit configuration of an electric power converter according to an eighth embodiment of the present invention.
Figure 21:
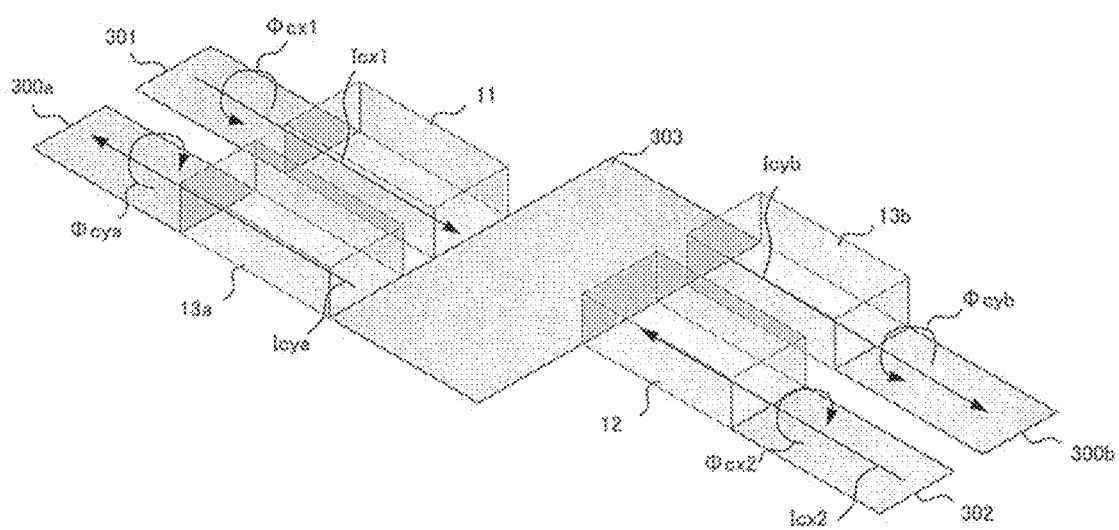
FIG. 21 is a diagram for illustrating an example of an arrangement of capacitors used in the electric power converter according to the eighth embodiment of the present invention.

FIG. 20 is a diagram for illustrating an example of a circuit configuration of an electric power converter according to an eighth embodiment of the present invention, and FIG. 21 is a diagram for illustrating an example of an arrangement of capacitors used in the electric power converter according to the eighth embodiment of the present invention.

In the eighth embodiment, as illustrated in FIG. 20, similarly to the above-mentioned seventh embodiment, the first Y capacitor 13a is connected between the connection points 303 and 300a, and the second Y capacitor 13b is connected between the connection points 303 and 300b. Further, as illustrated in FIG. 21, the common mode current Icya flowing through the inductance Lcya between the connection points 303 and 300a and the common mode current Icx1 flowing through the inductance Lcx1 between the connection points 301 and 303 are caused to flow in directions different from each other by 180 degrees or substantially 180 degrees. Similarly, the common mode current Icyb flowing through the inductance Lcyb between the connection points 303 and 300b and the common mode current Icx2 flowing through the inductance Lcx2 between the connection points 302 and 303 are caused to flow in directions different from each other by 180 degrees or substantially 180 degrees. The first X capacitor 11, the second X capacitor 12, the first Y capacitor 13a, the second Y capacitor 13b, and the metal conductors are arranged so as to satisfy the relationships of those directions.

Therefore, as illustrated in FIG. 21, the magnetic flux Φcx1 caused by the common mode current Icx1 and a magnetic flux Φcya caused by the common mode current Icya act so as to mutually cancel the magnetic fluxes by each other. Similarly, the magnetic flux Φcx2 caused by the common mode current Icx2 and a magnetic flux Φcyb caused by the common mode current Icyb act so as to mutually cancel the magnetic fluxes by each other. As a result, because of the mutual inductance, both of an effective inductance between the connection points 301 and 300a and an effective inductance between the connection points 302 and 300b become smaller, and the filter effect with respect to the common mode noise is further improved.

In the eighth embodiment, the first X capacitor 11 and the first Y capacitor 13a are magnetically coupled to each other, and the second X capacitor 12 and the second Y capacitor 13b are magnetically coupled to each other, but the combination of the coupling is not limited thereto. That is, in the eighth embodiment, the first X capacitor 11 and the second Y capacitor 13b may be magnetically coupled to each other, and the second X capacitor 12 and the first Y capacitor 13a may be magnetically coupled to each other.

Further, the above-mentioned first to eighth embodiments can be combined in various ways. For example, the resistors adopted in the above-mentioned third embodiment can be used also in the above-mentioned second embodiment and the above-mentioned fourth to eighth embodiments. Circuit elements other than resistors can be adopted. A section between the connection points 303 and 300 is divided into two parts so that the assumed currents flow in directions different from each other by 180 degrees, but a section between the connection points 301 and 303 or a section between the connection points 302 and 303 may be divided. In view of those points as well, various modifications can be made.

REFERENCE SIGNS LIST 1 electric power converter, 11 first X capacitor (first capacitor), 12 second X capacitor (first capacitor), 13 Y capacitor (second capacitor), 13a first Y capacitor (second capacitor), 13b second Y capacitor (second capacitor), 14 first resistor, 15 second resistor, 101 to 104 switching element, 201 power source, 202 load, 300, 300*a*, 300*b*, 301 to 303 connection point, Icx1, Icx2, Icy, Icy1, Icy2, Icya, Icyb common mode current, Lcx1, Lcx2, Lcya, Lcyb, Lcy1, Lcy2 inductance, Vcom1, Vcom2 voltage between terminals, Φcx1, Φcx2, Φcy, Φcy1, Φcy2, Φcya, Φcyb magnetic flux.

The invention claimed is:

1. An electric power converter which is configured to perform conversion of power supplied from a power source to a load, the electric power converter comprising:
a plurality of first capacitors connected in series between a positive line and a negative line of the power source used for supply of the power; and
at least one second capacitor connected between a ground node and a connection point between two first capacitors among the plurality of first capacitors,
wherein the ground node is electrically separated from the negative line of the power source and from a negative line of the load,
each of the two first capacitors has a first capacitor body, respectively,
the at least one second capacitor has a second capacitor body,
the first capacitor body of one first capacitor of the two first capacitors is arranged so that a shorter side of the first capacitor body opposes a shorter side of the first capacitor body of another first capacitor of the two first capacitors, and
a shorter side of the second capacitor body is arranged at 90 degrees with respect to the shorter sides of the first capacitor bodies that oppose one another, so that an absolute value of an angle formed between a direction of a current flowing through the at least one second capacitor and a direction of a current flowing through each of the two first capacitors is 90 degrees.

2. The electric power converter according to claim 1, further comprising a resistor connected in parallel to the one first capacitor and a resistor connected in parallel to the another first capacitor.

3. The electric power converter according to claim 1, wherein a current path between the connection point and another connection point connected to the ground node includes two partial paths through which currents flow in directions different from each other by 180 degrees.

4. The electric power converter according to claim 1, wherein the two first capacitors are arranged so that currents flow therethrough in directions different from each other by 180 degrees.

5. The electric power converter according to claim 1, wherein a switching element which is to be used for the conversion of power, is a wide bandgap semiconductor.

6. The electric power converter according to claim 1, wherein the two first capacitors are arranged so that currents, which flow through the two first capacitors, respectively, flow toward each other.

7. An electric power converter which is configured to perform conversion of power supplied from a power source to a load, the electric power converter comprising:
a plurality of first capacitors connected in series between a positive line and a negative line of the power source used for supply of the power; and
at least one second capacitor connected between a ground node and a connection point between two first capacitors among the plurality of first capacitors,
wherein the ground node is electrically separated from the negative line of the power source and from a negative line of the load,
each of the two first capacitors has a first capacitor body, respectively,
the at least one second capacitor has a second capacitor body,
the first capacitor body of one first capacitor of the two first capacitors is arranged so that a shorter side of the first capacitor body opposes a shorter side of the first capacitor body of another first capacitor of the two first capacitors, and
the first capacitor body of the another first capacitor is arranged side by side with the second capacitor body so that a direction of a current flowing through the at least one second capacitor and a direction of a current flowing through the another first capacitor are different from each other by 180 degrees and a direction of a current flowing through the one first capacitor and a direction of a current flowing through the another first capacitor are different from each other by 180 degrees.

8. The electric power converter according to claim 7,
wherein the at least one second capacitor is one of a plurality of second capacitors, and
wherein the plurality of second capacitors are connected to different connection points for grounding respectively.

9. The electric power converter according to claim 8,
wherein one of two second capacitors among the plurality of second capacitors and the one first capacitor are arranged so that currents flow therethrough in directions different from each other by 180 degrees, and
wherein the other of the two second capacitors and the another first capacitor are arranged so that currents flow therethrough in directions different from each other by 180 degrees.

10. The electric power converter according to claim 7, wherein the two first capacitors are arranged so that currents flow therethrough in directions different from each other by 180 degrees.

11. The electric power converter according to claim 7, wherein a switching element which is to be used for the conversion of power, is a wide bandgap semiconductor.

12. The electric power converter according to claim 7, wherein a current path between the connection point and another connection point connected to the ground node includes two partial paths through which currents flow in directions different from each other by 180 degrees.

* * * * *